USO05141898A

United States Patent [19]

Lapham

[11] Patent Number: 5,141,898
[45] Date of Patent: Aug. 25, 1992

[54] INTEGRATED CIRCUIT WITH MEANS FOR REDUCING ESD DAMAGE

[75] Inventor: Jerome F. Lapham, Groton, Mass.

[73] Assignee: Analog Devices, Incorporated, Norwood, Mass.

[21] Appl. No.: 766,848

[22] Filed: Sep. 27, 1991

Related U.S. Application Data

[60] Division of Ser. No. 683,340, Apr. 10, 1991, which is a continuation of Ser. No. 395,886, Aug. 18, 1989, abandoned, which is a continuation of Ser. No. 151,555, Feb. 2, 1988, abandoned.

[51] Int. Cl.$^5$ .................. H01L 21/70; H01L 21/90; H01L 21/98
[52] U.S. Cl. ................... 437/238; 437/239; 357/23.13; 357/54
[58] Field of Search ............ 437/238, 239; 357/23.13, 54

[56] References Cited

U.S. PATENT DOCUMENTS

| | | | |
|---|---|---|---|
| 4,435,447 | 3/1984 | Ito et al. | 437/238 |
| 4,455,568 | 6/1984 | Shiota | 357/54 |
| 4,602,267 | 7/1986 | Shirato | 357/23.13 |
| 4,720,737 | 1/1988 | Shirato | 357/23.13 |
| 4,729,009 | 3/1988 | Ang | 357/54 |
| 4,806,999 | 2/1989 | Strauss | 357/23.13 |

FOREIGN PATENT DOCUMENTS 0057024 8/1982 European Pat. Off.

OTHER PUBLICATIONS

Wolf et al. *Silicon Processing for the VLSI Era*, vol. 1 Process Technology, Lattice Press, 1986, p. 183.

*Primary Examiner*—Mary Wilczewski
*Attorney, Agent, or Firm*—Parmelee, Bollinger & Bramblett

[57] ABSTRACT

An integrated-circuit (IC) chip having means to prevent or mitigate damage from electrostatic discharge (ESD) employing a thick dielectric coating of insulative oxide between the surface of the chip substrate and the metallization film used to make contact with regions of the substrate. At least a portion of this layer is formed at temperatures below 700° C. The coating is sufficiently thick everywhere that its breakdown voltage is greater than the breakdown voltage of any junction in the substrate. This assures that the breakdown caused by ESD will always occur in the junction, which is self healing, rather than in the dielectric coating, where the damage could be permanent.

4 Claims, 1 Drawing Sheet

INTEGRATED CIRCUIT WITH MEANS FOR REDUCING ESD DAMAGE

This application is a divisional of application Ser. No. 683,340 filed Apr. 10, 1991 which is a continuation of application Ser. No. 395,886 filed Aug. 18, 1989 now abandoned which is a continuation of Ser. No. 151,555 filed Feb. 2, 1988, now abandoned.

BACKGROUND OF THE INVENTION

1. Field of the Invention

This invention relates to integrated circuits (ICs) comprising a substrate carrying a large number of circuit elements such as transistors and the like. More particularly, this invention relates to ICs having means to reduce damage from the effects of electrostatic discharge (ESD).

2. Prior Art

It is well known that ICs are subject to serious damage or destruction as a result of Electrostatic Discharge (ESD) events. The electrostatic voltage associated with the discharge can be developed by any of many sources, such as lighting, or friction between insulating bodies such as synthetic fiber clothing. Damage occurs when the ESD voltage is accidentally coupled to one of the circuit terminals and thence to some portion of the metal interconnect layer of the IC.

The metal interconnect is typically an Aluminum layer laid down over an oxide coating overlying the top surface of the semiconductor. The ESD voltage can cause a current to flow from the metal through the normally nonconducting oxide coating to the underlying semiconductor. The current then leaves the IC through some other circuit terminal. The magnitude of the current is often sufficient to cause significant damage to the oxide, particularly by leaving it permanently conducting. The resulting shunt pasth often causes circuit failure.

Various attempts have been made to prevent damage from ESD events. For example, semiconductor elements which require thin oxides, such as MOS transistors and MOS capacitors, are often protected by additional devices which bypass the ESD current and thereby protect the element in question. In general, a separate bypass device must be provided for each element requiring protection. However, in some particular cases the protection device may be shared by more than one element requiring protection. In any event, providing protection devices to prevent damage from ESD events adds to the complexity of the IC, requires additional IC area, and generally is a quite undesirable practice.

Many ICs are made with semiconductive elements which, unlike MOS transistors, do not require thin oxides, for example bipolar transistors. These ICs nevertheless may as a result of the particular process steps carried out have thin oxides in certain places, or may have had the usual thermal oxide completely or almost completely removed in selected places, and are thus susceptible to ESD induced damage. This invention describes a process for use with such ICs which eliminates the need to provide specific protection devices in accordance with prior practice.

SUMMARY OF THE INVENTION

A critical characteristic in accordance with the invention is that the total thickness of the insulative coating between the substrate and the metal interconnect is made great enough to assure that the dielectric breakdown voltage through the insulation is greater than the breakdown voltage of any of the junctions formed in the substrate. Thus, when electrostatic discharge occurs of sufficient intensity to cause breakdown, the breakdown occurs at a junction, not through the insulative coating. Since junction damage is self-healing, the injury to the IC will not be permanent as it would be if the breakdown occurred in the insulative coating.

A second critical characteristic in accordance with the invention is that the thick insulative coating on the substrate is at least partly comprised of low-temperature (LT) dielectric material deposited after formation of the junctions. Deposition at relatively low temperatures assures that no detrimental changes occur in the already-formed junctions.

In one preferred embodiment of the invention, to be described hereinbelow in detail, an IC structure is provided wherein the insulative coating for the substrate comprises two adjacent layers just beneath the metal interconnect. The first layer of the coating is the usual thermally-grown Silicon dioxide, formed at a relatively high temperature during conventional processing of the integrated circuit. The second layer is a deposited layer of Silicon dioxide, developed at a relatively low temperature, sufficiently low to assure that already-formed junctions in the IC are not altered detrimentally during deposition of the oxide.

In other embodiments of the invention, the thermally-grown oxide laid down during conventional IC processing may be partially or wholly removed, at least in selected regions of the substrate, prior to deposition of a low-temperature insulative coating of thickness sufficient to minimize the possibility of ESD damage in accordance with the invention.

Still other objects, aspects and advantages of this invention will in part be pointed out in and in part apparent from, the following detailed description of one embodiment considered together with the accompanying drawings.

DETAILED DESCRIPTION OF A PREFERRED EMBODIMENT

Figure 1:
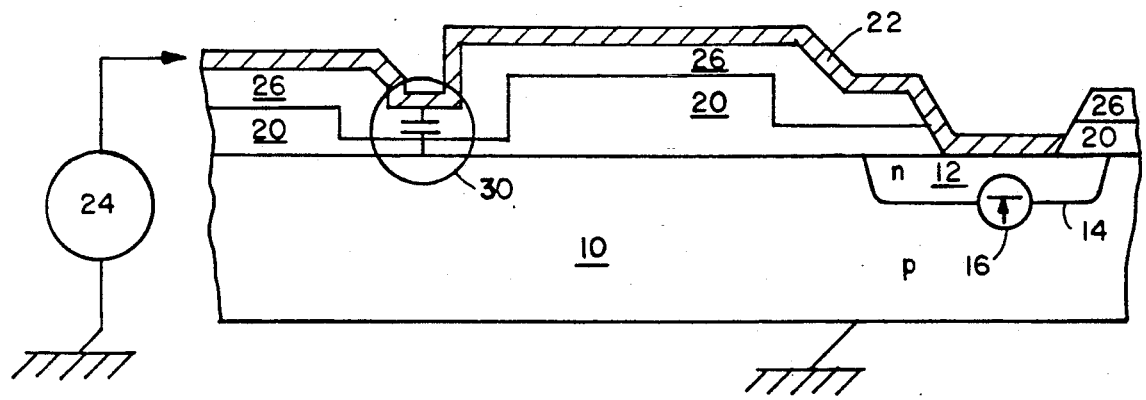
FIG. 1 is a vertical section through an integrated circuit chip, not to scale and with certain aspects shown pictorially.

Referring first to FIG. 1, there is shown an integrated circuit (IC) comprising a substrate 10, commonly made of Silicon and shown in this example as being p-type. This substrate is supplied with n-type inpurities by conventional techniques, such as chemical vapor deposition (CVD) or ion implantation. These impurities are driven-in (diffused) into the substrate so as to form an n-type region 12 establishing a junction 14 with the p-type substrate material. A diode symbol 16 is shown at the junction to illustrate pictorially the electrical characteristics of the junction.

A typical IC will of course include a multiplicity of other junctions (not shown), forming both diodes and transistors which together comprise the elements of the circuit the particular IC device. These other junctions are not shown herein in order to simplify the presentation.

During the formation of the various junctions throughout the substrate 10, a protective insulating dielectric layer such as Silicon dioxide, illustrated at 20, is thermally grown over the surface of the substrate, in known fashion. This later is formed at a relatively high temperature, preferably above 700° C. In such growth, $O_2$ (oxygen), in pure gaseous form or as part of water vapor ($H_O$), combines with Silicon atoms from the substrate to form Silicon dioxide ($SiO_2$). Since portions of the thermally-grown oxide must be removed in various places, as part of the implant and/or diffusion processes involved in making the many IC junctions, the final thickness of this oxide layer 20 will vary considerably from place to place, as shown in FIG. 1.

In accordance with known prior art, a layer of metallization such as illustrated at 22 normally is laid down next, over the thermally-grown oxide 20, in order to make electrical connections to selected regions of the substrate surface. Experience with devices formed in that fashion has shown an excessive degree of sensitivity to electrostatic discharge (ESD) voltages developed on the metallization layer 22. Such ESD voltage is diagrammatically illustrated in FIG. 1 by a symbolic voltage source 24 with one terminal poised to be connected to the metallization layer 22, and its other terminal connected to ground.

It has been found that the excessive sensitivity to ESD in the prior art IC constructions can be overcome or substantially mitigated by a new IC construction, and process of making such an IC, as will now be described. In this new construction, an additional layer 26 of oxide is laid down, in this case over the thermally-grown layer 20, just beneath the metallization layer 22. This additional layer, however, unlike the initial layer 20, is formed at a relatively low temperature (below 700° C). This distinction is important, because the addition of a low-temperature (LT) oxide assures that creation of the layer does not adversely affect the junctions which already have been formed in the substrate.

Figure 2:
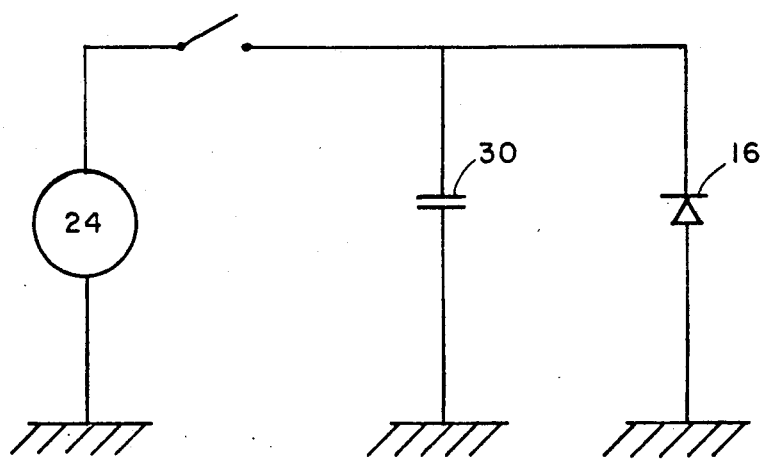
FIG. 2 is a schematic diagram representing elements of the IC chip of FIG. 1.

The additional layer 26 is made sufficiently thick so as to assure that the total thickness of the oxide coating (20, 26) is sufficient that the dielectric breakdown voltage ($V_{DBKD}$) of the dielectric material between the substrate and metallization layer 22 is greater than the junction breakdown voltage ($V_{JBKD}$) of the IC, in this case, the breakdown voltage of the junction 14. Fig. 2 illustrates how the ESD source 24 is in effect connected to the paralleled combination of the minimum breakdown-voltage dielectric region (i.e., where the dielectric is thinnest, and shown as a capacitor 30) and the minimum breakdown-voltage junction (diode 16, illustratively). When the ESD reaches a level sufficient to cause breakdown, that breakdown will in accordance with the invention occur in the junction (e.g. diode 16), not in the dielectric (20, 26) of the capacitor 30.

This can graphically be explained by reference to FIG. 3 which is a current-voltage (I-V) plot where the solid-line curve 36 is for a dielectric layer such as represented by the composite coating 20, 26, and the dotted line curve 38 is for a junction such as diode 16.

As shown by the solid-line curve 36, the current in the dielectric gradually increases (the magnitude being shown exaggeratedly in FIG. 3) with increases in voltage until the dielectric breakdown voltage $V_{DBKD}$ is reached. At that point, the current increases rapidly, and the voltage decreases to a very low level (reflecting the near short circuit represented by the dielectric material after break down).

By providing an additional oxide coating (i.e. by applying a deposited layer (26) of low-temperature oxide as discussed above), the magnitude of the dielectric breakdown voltage $V_{DBKD}$ is increased as compared to the breakdown voltage for the thermally-grown layer (20) by itself. The actual dielectric breakdown voltage is given (somewhat conservatively) by the following relationship:

$$V_{DBKD} = (0.06 \text{ Volts/Angstroms}) \text{ (thickness in Angstroms)}.$$

A thickness of 10,000 Å thus will provide protection against an ESD event of about 600 volts. With rare exceptions, all IC junctions break down at voltages less than 600 volts.

Figure 3:
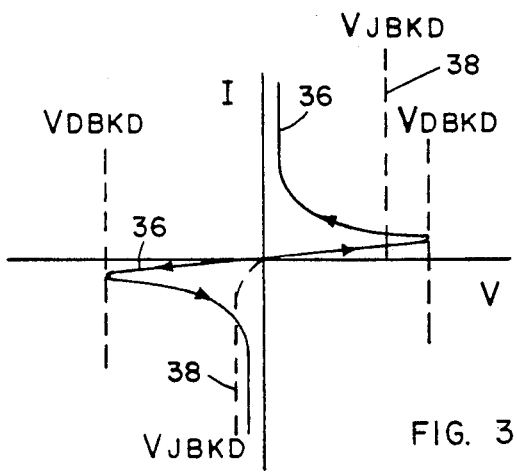
FIG. 3 is a graphical presentation of aid in explaining the operation of the invention.

The final dielectric coating (20, 26) preferably is made sufficiently thick that its breakdown voltage $V_{DBKD}$ is greater than the junction breakdown voltage $V_{JBKD}$, shown as a vertical dotted line in the first quadrant of the FIG. 3 graph. Thus, for positive ESD voltage excursions, breakdown will first occur at the junction (e.g. junction 14), and this will prevent any subsequent breakdown in the dielectric material. Since such a junction breakdown is self-healing (i.e. it returns to operative condition after a short period of time), there will be no permanent damage to the IC as a result of the electrostatic discharge. For a negative ESD voltage excursion, the diode 16 will be forward-biased and will pass current at voltages much less than the dielectric breakdown voltage of the oxide, thus protecting the oxide in the same way.

The low-temperature oxide coating can be deposited prior to the metallization mask step in any of various ways. Typically, chemical vapor deposition (CVD) will be used. For example, silane gas ($SiH_4$) can be caused to flow over the wafers together with oxygen, thereby to form $SiO_2$. Sputtering also can be employed. Still other sources and oxidants can be used, e.g. tetraethyl orthosilicate and nitrous oxide. In each case, the Silicon for the low temperature $SiO_2$ coating is supplied externally, i.e. it is not derived from the substrate as it is with theramlly-grown (high-temperature) oxide. The deposition of the additional layer is performed at a temperature less than 700° C. so as to assure that the already-formed junctions in the IC are not adversely affected as a result of the additional processing.

In the particular preferred embodiment described hereinabove, the substrate is provided with a multilayer oxide coating, wherein one layer is a high-temperature (HT) layer next to the substrate, and the other is a low-temperature (lT) layer 26 just beneath th metallization layer. It will be understood, however, that the concept of the invention is to deposit low-temperature dielectric insulation on the substrate in sufficient thickness to assure that the overall dielectric breakdown voltage is greater than the junction breakdown voltage. In some cases, the high-temperature oxide may be partially or fully removed, at least in some places, prior to deposit of the low-temperature (LT) insulative coating, in which event the LT coating thickness must be made sufficient by itself to assure the necessary dielectric breakdown voltage.

Accordingly, although a specific preferred embodiment of the invention has been described hereinabove in detail, it is to be understood that this is for the purpose of providing an illustrative example of the invention and is not to be construed as necessarily limitative, since it is apparent that those skilled in this art can make many modifications as required for specific applications without departing from the scope of the invention.

What is claimed is:

1. The method of making a monolithic chip of a type having an integrated circuit comprising a multiplicity of transistor circuit elements each having at least one p/n junction, said chip being resistant to damage from electrostatic discharge without the provision of any protection device separate from or additional to said transistor circuit elements of said integrated circuit, comprising the steps of:

providing a semiconductive substrate with impurities to form doped regions establishing said multiplicity of transistor circuit elements with junctions, said circuit elements when interconnected together forming said integrated circuit;

growing high temperature dielectric over said substrate as part of the integrated circuit forming process;

depositing low-temperature dielectric over said substrate, said low-temperature dielectric being of sufficient thickness that said substrate is formed with dielectric material having a total thickness providing a dielectric breakdown voltage greater than the breakdown voltage of any of said circuit element junctions; and forming a metal interconnect layer over said low-temperature dielectric and including a portion making electrical connection to at least one of said doped regions establishing said junctions, said low-temperature dielectric being positioned to lie under said metal interconnect layer at all portions thereof needing a build-up of dielectric thickness to reach said total thickness, whereby an electrostatic discharge from said metal interconnect will pass through and break down a junction of one of said transistor circuit elements rather than said dielectric material.

2. The method of claim 1, wherein said dielectric material on said substrate includes two distinct layers, one being said layer of high-temperature dielectric, and the other being said layer of low-temperature dielectric laid down over said layer of high-temperature dielectric, said two layers being in contact in at least certain regions thereof and having a combined thickness in all regions thereof beneath said interconnect layer sufficient to create a dielectric breakdown voltage greater than the breakdown voltage of any of said junctions.

3. The method of claim 2, wherein said high-temperature dielectric layer is thermally grown at a temperature greater than 700° C; and said low-temperature dielectric layer is deposited at a temperature less than 700° C.

4. The method of claim 1, wherein said low and high temperature dielectric comprises oxides.

* * * * *